(12) United States Patent
Moore

(10) Patent No.: US 6,841,739 B2
(45) Date of Patent: Jan. 11, 2005

(54) FLEXIBLE CIRCUIT BOARD HAVING ELECTRICAL RESISTANCE HEATER TRACE

(75) Inventor: Kevin D. Moore, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 330 days.

(21) Appl. No.: 10/208,942

(22) Filed: Jul. 31, 2002

(65) Prior Publication Data

US 2004/0020687 A1 Feb. 5, 2004

(51) Int. Cl.[7] .................................................. H05K 1/03
(52) U.S. Cl. ...................... 174/255; 219/209; 219/424; 29/830; 29/831
(58) Field of Search ................................ 174/250, 254, 174/255, 260; 219/209, 424; 29/830, 831

(56) References Cited

U.S. PATENT DOCUMENTS

| | | | |
|---|---|---|---|
| 3,341,742 A | 9/1967 | Klehm, Jr. | |
| 4,913,955 A | 4/1990 | Noda et al. | |
| 4,958,260 A | 9/1990 | Kobayashi et al. | |
| 5,008,496 A | 4/1991 | Schmidt et al. | |
| 5,010,233 A * | 4/1991 | Henschen et al. | 219/209 |
| 5,121,297 A | 6/1992 | Haas | |
| 5,144,534 A | 9/1992 | Kober | |
| 5,170,326 A | 12/1992 | Meny et al. | |
| 5,177,371 A * | 1/1993 | Faulk | 219/543 |
| 5,428,190 A | 6/1995 | Stopperan | |
| 5,434,362 A | 7/1995 | Klosowiak et al. | |
| 5,638,597 A | 6/1997 | Cutting et al. | |
| 5,831,828 A | 11/1998 | Cutting et al. | |
| 5,903,440 A | 5/1999 | Blazier et al. | |
| 5,963,427 A | 10/1999 | Bollesen | |
| 5,972,152 A | 10/1999 | Lake et al. | |
| 5,981,870 A | 11/1999 | Barcley et al. | |
| 5,998,738 A | 12/1999 | Li et al. | |
| 6,012,221 A | 1/2000 | Campbell | |
| 6,224,951 B1 | 5/2001 | Centanni et al. | |
| 6,292,370 B1 * | 9/2001 | Anderson et al. | 361/748 |
| 6,423,939 B1 * | 7/2002 | Pan | 219/209 |
| 6,477,052 B1 | 11/2002 | Barcley | |
| 6,486,450 B1 * | 11/2002 | Quinlan et al. | 219/494 |
| 6,621,055 B2 * | 9/2003 | Weber et al. | 219/494 |

FOREIGN PATENT DOCUMENTS

| | | |
|---|---|---|
| EP | 1 124 395 A1 | 8/2001 |
| WO | WO 00/76243 A1 | 12/2000 |
| WO | WO 01/80591 A2 | 10/2001 |
| WO | WO 02/093970 A1 | 11/2002 |

* cited by examiner

Primary Examiner—Kamand Cuneo
Assistant Examiner—Jeremy Norris
(74) Attorney, Agent, or Firm—Thomas V. Miller; Brian M. Mancini

(57) ABSTRACT

A flexible circuit board (20) having a substantially rigid substrate (22) and an electrical resistance heater trace (24). The substantially rigid substrate (22) has a first portion (26), a second portion (28), and a bend region (30). The bend region (30) interconnects the first portion (26) and the second portion (28). The electrical resistance heater trace (24) is formed on the bend region (30) of the substrate (22). The first portion (26) of the substrate (22) is capable of being folded relative to the second portion (28) of the substrate (22) to form at least one bend (72, 172) in the bend region (30) when an electric current is applied to the heater trace (24). There is also an electronic control unit (60, 160) that includes the flexible circuit board (20) and a method of assembling an electronic control unit (60, 160).

17 Claims, 4 Drawing Sheets

FLEXIBLE CIRCUIT BOARD HAVING ELECTRICAL RESISTANCE HEATER TRACE

FIELD OF THE INVENTION

This invention in general relates to circuit boards for electronic control units and, more particularly, to a method and apparatus for increasing the flexibility of a circuit board through localized heating by an electrical resistance heater trace.

BACKGROUND OF THE INVENTION

Engine mounted electronic control units for vehicular engines are subject to a high level of heat and vibration and generally disposed in a confined space. In these applications, electronic components and circuits may be formed on a relatively thin substrate that is enclosed within a rigid housing. In order to enhance thermal performance protection against engine vibration, the thin substrate is affixed to a rigidizer that may be bent to produce a reduced size module and that also functions as a heat spreader.

For example, one type of direct engine mount application uses a Polybent™ printed circuit board. This is a printed circuit board that has a flexible circuit board that is mounted to an aluminum rigidizer. The rigidizer provides mechanical support for the printed circuit board and assists in the dissipation of heat generated by components on the printed circuit board, which heat is conductively transferred from the components to the underlying rigidizer. One reference that describes an electronic control unit using a Polybent™ printed circuit board is U.S. Pat. No. 5,998,738, which is owned by the assignees of the present invention and hereby incorporated by reference herein in its entirety.

As the functionality of electronic control units has increased over time, the corresponding circuitry has become increasingly dense and complex. As a result, electronic control units have been migrating from the use of two-layer printed circuit boards to the use of four-layer printed circuit boards. One result of four-layer printed circuit boards is increased thickness. Thicker flexible circuit boards are known to crack or split when bent, resulting in a control unit that must be discarded. Discarded control units results in excessive manufacturing costs and waste, especially since the printed circuit board must be populated with components before being folded.

Moreover, the type of material used for the substrate will affect the degree of flexibility of the board. For example, a material that is well known in the construction of circuit boards is a type of epoxy glass known as FR4. FR4 has a glass weave impregnated with epoxy resin and is generally known to be relatively stiff. Although FR4 and other more rigid substrates are substantially less expensive than very flexible substrates, the use of more rigid substrates presents the added problem of cracking and splitting when trying to bend the substrate to a confined space.

U.S. Pat. No. 6,292,370, owned by the assignees of the present invention and hereby incorporated by reference herein in its entirety, describes that cracking and other damage may be avoided by heating the substrate to within about 10° C. of the glass transition temperature of the FR4 material. The reference recites that this may be accomplished by passing the circuit substrate through an oven.

A need exists, however, for improved devices and methods for increasing the flexibility of more rigid substrates to reduce splitting and cracking. For instance, a need exists to reduce the cost in the energy expended in passing the circuit substrate through an oven. There is also a need to reduce the time needed to heat up the substrate over the known method of passing the circuit substrate through an oven. It is, therefore, desirable to provide an improved device and method of heating a substrate to overcome most, if not all, of the preceding problems.

Figure 1:
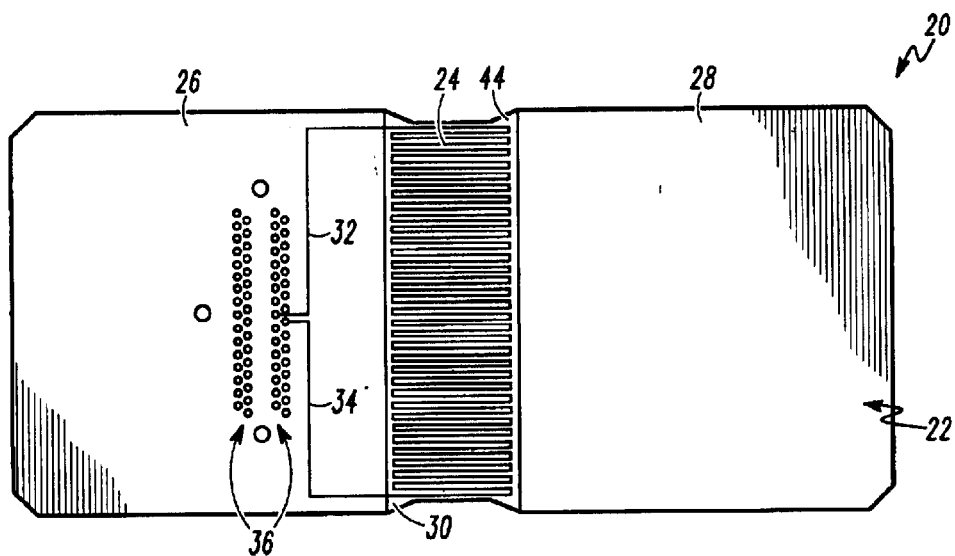
FIG. 1 is a plan view of a flexible circuit board in one embodiment of the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a device and method for increasing the flexibility of a circuit board through localized heating. For purposes of illustration, an example of the device and method will be described in the context of an electronic control unit for a vehicle. However, the present invention is not limited to units for vehicles but may also apply to other housings or devices where flexibility of a circuit board is needed.

To this end, generally, in one embodiment there is a flexible circuit board having a substantially rigid substrate and an electrical resistance heater trace. The substantially rigid substrate has a first portion, a second portion, and a bend region. The bend region interconnects the first portion and the second portion. The electrical resistance heater trace is formed on the bend region of the substrate. The first portion of the substrate is capable of being folded relative to the second portion of the substrate to form at least one bend in the bend region when an electric current is applied to the heater trace.

In another embodiment, there is an electronic control unit having a rigidizer, a substantially rigid substrate, and an electrical resistance heater trace. The rigidizer has a first rigidizer portion and a second rigidizer portion that is interconnected by a connecting rigidizer portion. The substrate has a first portion, a second portion, and a bend region. The bend region interconnects the first portion and the second portion. The first portion of the substrate is attached to the first rigidizer portion. The second portion of the substrate is attached to the second rigidizer portion. The electrical resistance heater trace is formed on the bend region of the substrate. The first portion of the substrate is capable of being folded relative to the second portion of the substrate to form at least one bend in the bend region when an electric current is applied to the heater trace.

Further, in another embodiment, there is a method for assembling an electronic control unit that includes the steps of: providing a substantially rigid substrate having a first portion and a second portion interconnected by a bend region; forming an electrical resistance heater trace on the bend region of the substrate; providing a rigidizer having a first rigidizer portion and a second rigidizer portion interconnected by a connecting rigidizer portion; attaching the first portion of the substrate to the first rigidizer portion; attaching the second portion of the substrate to the second rigidizer portion; applying an electrical current to the electrical resistance heater trace; and folding the first portion of the substrate relative to the second portion of the substrate to form at least one bend in the bend region.

Figure 2:
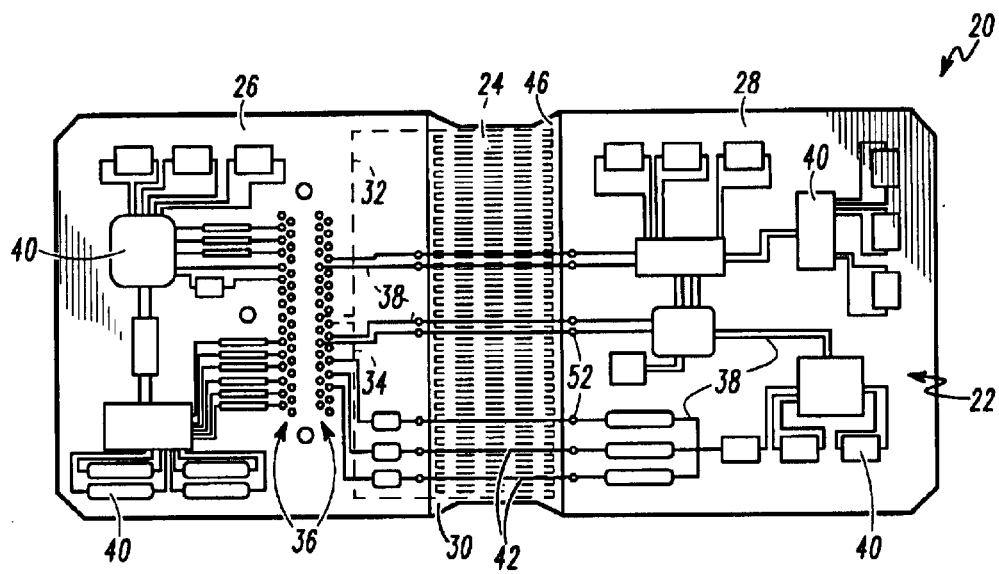
FIG. 2 is a plan view of the opposite side of the flexible circuit board in FIG. 1.

Now, turning to the drawings, an example use of a device and method will be explained in the context of an electronic control unit for a vehicle. FIGS. 1 and 2 show opposite sides of a flexible circuit board 20 that would reside within an electronic control unit. In one embodiment, generally, the flexible circuit board has a substantially rigid substrate 22 and an electrical resistance heater trace 24. The substantially rigid substrate 22 has a first portion 26 and a second portion 28 that is interconnected by a bend region 30. The substantially rigid substrate 22 may be made of FR4 or other more rigid organic based substrates. FR4 is a material having at least one layer of glass weaves impregnated with epoxy resin. Other types of epoxy glass and polyimides are also commercially available. The substantially rigid substrate 22 may also be made of multiple layers of a substrate material laminated together that make the substrate more stiff or brittle.

The electrical resistance heater trace 24 is formed on the bend region 30 of the substrate 22. In one embodiment, as shown in FIG. 1, the electrical resistance heater trace 24 is formed in a serpentine shape that is uniform along the entire bend region 30 of the substrate 22. In one suitable device, an adequate width of the heater trace 24 was found to be about 10 mils and the spacing between each serpentine trace was about 25 mils, center-to-center. The heater trace 24 may be made of a metallic conductive material such as copper, nickel or gold. In this embodiment, each end of the electrical resistance heater trace 24 has connector traces 32 and 34 that interconnect the heater trace 24 to connector holes 36. As will be explained in more detail below, the connector holes 36 are used for attaching an external power source for generating a current through the heater trace 24. This, in turn, will generate heat that is localized at the bend region 30 to permit folding or bending of the substrate 22.

FIG. 2 shows the opposite side of the substrate 22. On the opposite side of the substrate 22, a plurality of conductive traces 38 are formed on the first portion 26 and second portion 28 of the substrate 22. The conductive traces 38 interconnect a plurality of electronic components 40 mounted on the substrate 22. The electronic components 40 may be any electronic component or device that can be mounted to a printed circuit board such as, for example, a battery, a capacitor, a resistor, a semiconductor chip, a diode, an inductor, and a coil. The conductive traces 38 are also electrically attached to the connector holes 36 for attachment to external connector pins (not shown). It will be appreciated by one of ordinary skill in the art, with the benefit of this disclosure, that the exact layout of the conductive traces 38 and the number of components 40 is not critical, but that the present invention can be used for many types of electrical circuits without departing from the spirit and scope of the present invention.

In the bend region 30 of the substrate 22, a series of connecting traces 42 are formed to interconnect the conductive traces 38 formed on the first portion 26 and second portion 28 of the substrate 22. Advantageously, the conductive traces 38 and the connecting traces 42 may be formed and covered with a rigid solder mask. That is, solder mask having an elongation of less than 10 percent. Typically flexible circuits require the use of flexible solder mask, i.e. solder mask having an elongation of up to 30 percent to account for tensile stress introduced in flexing the circuit board. Flexible solder mask, however, is substantially more expensive than rigid solder mask.

Figure 3:
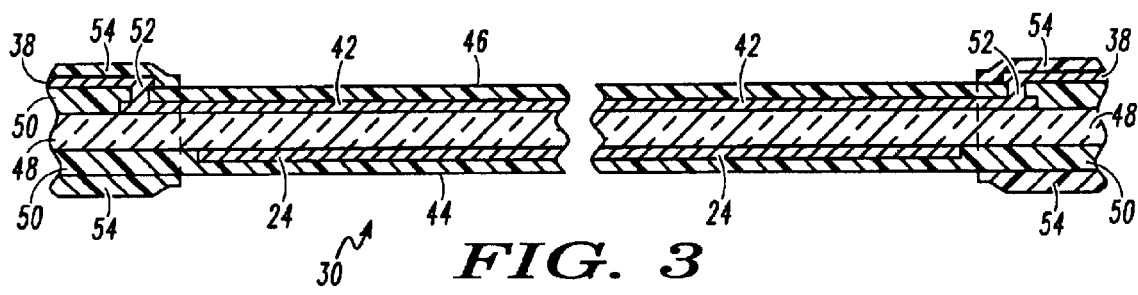
FIG. 3 is a cross section view of a bend region of the flexible circuit board in FIG. 1.

In one embodiment, the bend region 30 has a first side 44 (FIG. 1) and a second side 46 (FIG. 2). The heater trace 24 is preferably formed on the first side 44 of the bend region 30 and the connecting traces 42 are formed on the second side 46 of the bend region 30. This is more fully illustrated in FIG. 3. FIG. 3 is a cross-sectional view of the bend region 30 of the substrate 22. The substrate 22 has at least one layer 48 of glass weave impregnated with resin. On each side of the layer 48, there is a layer 50 of epoxy. This epoxy layer 50 may be resin-coated copper (RCC) that is commercially available with FR4 substrate material. Formed on the first side 44 of the bend region 30 is the heater trace 24. Formed on the second side 46 of the bend region 30 is a connecting trace 42. The connecting trace 42 may be electrically connected to the conductive traces 38 of the first portion 26 and the second portion 28 of the substrate 22 by vias 52. The cross-section further illustrates an outer solder mask layer 54 on opposite sides of the circuit board 20. It is preferred that the solder mask layers 54 not extend into the bend region 30.

Figure 4A:
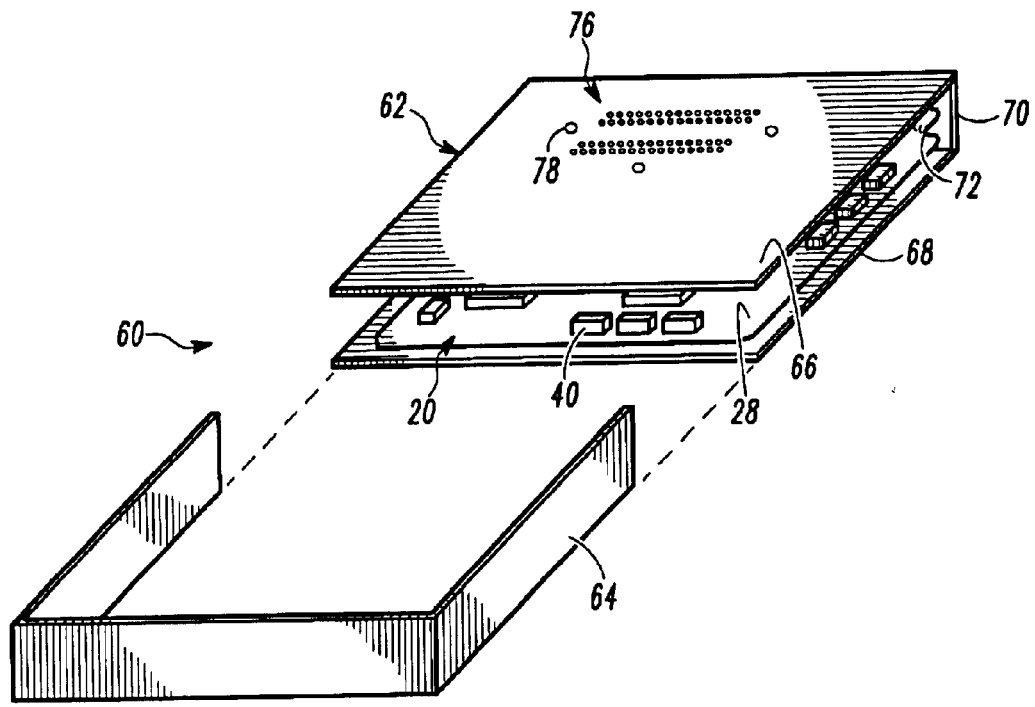
FIG. 4A is an exploded perspective view of an electronic control unit in accordance with an embodiment of the present invention.
Figure 4B:
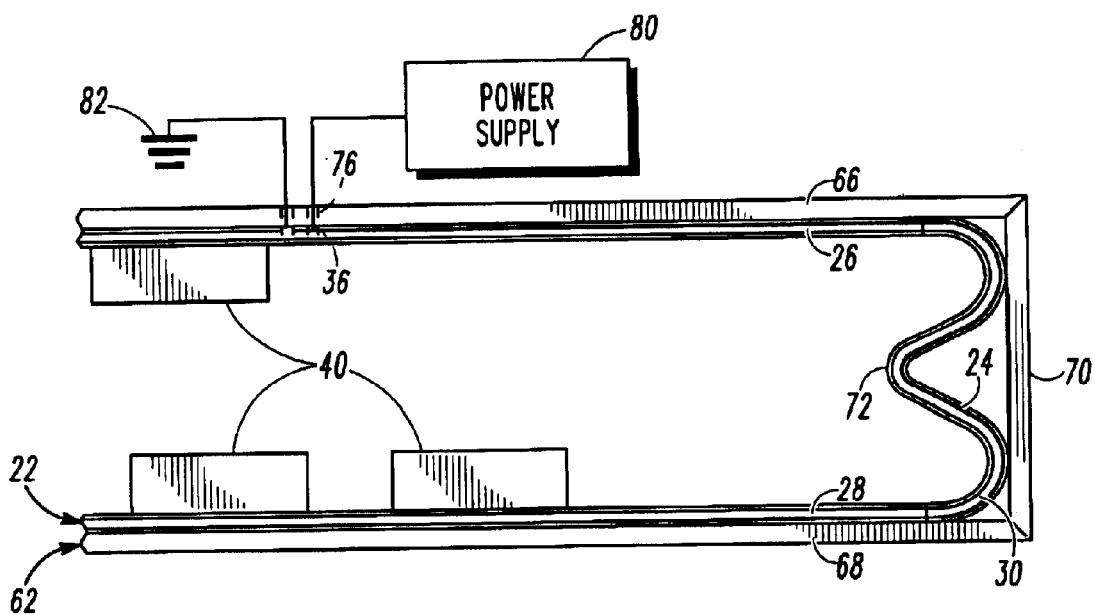
FIG. 4B is a side view of a portion of the electronic control unit in FIG. 4A.

Referring now to FIGS. 4A and 4B, an exemplary electronic control unit 60 having a flexible circuit board 20 is shown. FIG. 4A is an exploded perspective view of the electronic control unit 60 in accordance with an embodiment of the present invention. FIG. 4B is a side view of a portion of the electronic control unit 60 showing the bend region 30 of the substrate 22 in one embodiment. The electronic control unit 60 has a rigidizer 62 and the flexible circuit board 20. The rigidizer 62 has a first rigidizer portion 66 and a second rigidizer portion 68 interconnected by a connecting rigidizer portion 70.

As explained above, the flexible circuit board 20 has a substantially rigid substrate 22 and an electrical resistance heater trace 24. The substantially rigid substrate 22 has a first portion 26 and a second portion 28 that is interconnected by a bend region 30. In this embodiment, the first portion 26 of the substrate 22 is attached to the first rigidizer portion 66. The second portion 28 of the substrate 22 is attached to the second rigidizer portion 68. In one embodiment, the attachment may be secured by an adhesive such as a pressure sensitive adhesive (PSA) tape or film. In another embodiment, the adhesive may be a heat curable, liquid adhesive that is screen printed on the first rigidizer portion 66 and the second rigidizer portion 68. Those who are of ordinary skill in the art, having the benefit of this disclosure, will realize that there are many techniques for securing the substrate 22 to the rigidizer 62, such as mechanical fasteners such as screws or other adhesive laminates that may be placed on the rigidizer 62, that may be used herein without departing from the spirit and scope of the present invention.

The rigidizer 62 surrounds the flexible circuit board 20 and is designed to shield the substrate 22 and electronic components 40 from electrical charge which can damage the substrate and components. Accordingly, the rigidizer 62 may also include a sidewall portion 64 to further interconnect the first rigidizer portion 66 and the second rigidizer portion 68. The sidewall portion 64 may be attached to the first rigidizer portion 66 and the second rigidizer portion 68 by a solder or weld. The attachment may also be secured through mechanical fasteners such as screws or an adhesive. The rigidizer 62 may also provide mechanical support and conductively dissipate heat for the substrate 22.

Preferably, the rigidizer 62 is manufactured from materials that are rigid enough to provide a rigid mechanical support for the flexible circuit board 20. In automobile applications, the rigidizer 62 should also be designed to shield the electronic components 40 from heat, water, chemicals, and electrostatic charge. Suitable materials for the rigidizer 62 are aluminum, steel, engineering grade plastic, magnesium, and zinc or any material that is resistant to chemicals and elements commonly found in an automobile. Preferably, the rigidizer 62 is further manufactured from thermally conductive materials and conductively transfers heat by components 40 during operation of the electronic control unit 60. However, those of ordinary skill in the art will realize that electronic control unit 60 may be used in low power operations where thermal issues, and the thermal conductivity of rigidizer 62 may be of minor importance.

The rigidizer 62 also includes a plurality of connector holes 76 that are arranged in the same manner to match the connector holes 36 in the substrate 22. The rigidizer 62 may further include mounting holes 78 to attach a connector housing (not shown). A plurality of connector pins on an external connector (not shown) may extend through the connector holes 76 in the rigidizer 62 and into the connector holes 36 of the substrate 22 to provide an electrical interface to the circuitry residing on the substrate 22.

As explained above, substrate 22 is preferably made from a relatively rigid material such as FR4 or a multi-layer polyimide material. The heater trace 24 is formed on the bend region 30 of the substrate 22. When an electric current is applied to the heater trace 24, the bend region 30 will be locally heated by the heater trace 24. This will allow the first portion 26 of the substrate 22 to be folded relative to the second portion 28 of the substrate 22.

In one embodiment, as shown in FIG. 4B, an electric current may be applied to the heater trace 24 by connecting the heater trace 24 to a power supply 80 and a ground 82. The power supply 80 and the ground 82 may be electrically connected to the heater trace 24 through the connector holes 36 in the substrate 22. Alternatively, the ground 82 can be a case ground. The connector holes 36 are interconnected to the heater trace 24 by connector traces 32 and 34 as illustrated in the plane view in FIG. 1. The amount of voltage and current supplied to the heater trace 24 will vary on the layout of the heater trace 24. However, it was found that a voltage of 13 volts and 0.8 amps was adequate to provide a sufficient electric current through the heater trace 24 to locally heat and allow bending of a substrate 22 at the bend region 30. The substrate 22 in that case was made of an FR4 material and the heater trace 24 was about 10 mils wide and about 25 mils apart in pitch (from center to center) in a serpentine shape. The serpentine heater trace 24 extended uniformly across the entire bend region 30.

It will be appreciated that the present invention provides the significant advantage of locally heating the bend region 30 of the substrate 22. It limits the heating to only the part of the substrate that needs to be bent. It uses a conductive heater trace 24 that requires only a small amount of energy to heat the bend region 30, thereby reducing manufacturing costs. The added cost of the trace is minimal compared to the amount of energy required to bake the entire board in an oven for bending. Additionally, the time constant for heating is very short compared to baking the entire board in an oven. Little soak time is needed to heat the bend region 30 because the thermal mass is much smaller.

It also has been found by the inventor that localized heating permits bending at a much lower temperature than that required in previous methods. For example, an FR4 material may have a glass transition temperature of about 150° C. It has been known to heat the entire board in an oven to within 10° C. of the glass transition prior to bending the substrate. However, it has been found, through the present invention, that a local heating of bend region 30 by the heater trace 24 would permit bending at temperatures of 85° C. This was achieved by using an electric current of 13 volts at 0.8 amps through the heater trace 24 described above. An electric current of 17 volts at 0.9 amps through the heater trace 24 yielded about 125° C. in the bend region 30. Accordingly, less energy is used to permit bending of the substrate 22.

It is anticipated that the heater trace 24 need only be connected to the power source 80 and ground 82 when bending of the substrate 22 is required. The power source 80 and ground 82 may be disconnected after the electronic control unit 60 is in the shape shown in FIG. 4A.

After an electric current passes through the heater trace 24, and the substrate 22 is folded at the bend region 30, the actual bend formed at the bend region 30 may take a variety of shapes. For example, in FIGS. 4A and 4B, there is a bend 72 that is in a W-shape. The W-shape permits very compact folding that can be of particular importance for automotive and other industrial applications. The W-shape bend 72 may be formed when the first rigidizer portion 66, the second rigidizer portion 68 and the connecting rigidizer portion 70 are all relatively flat. As explained above, the first portion 26 of the substrate 22 is attached to the first rigidizer portion 66 and the second portion 28 of the substrate 22 is attached to the second rigidizer portion 68. This attachment may be done when the first rigidizer portion 66 and the second rigidizer portion 68 are laying flat relative to each other in the same plane. The bend region 30 of the substrate 22 is not attached to the connecting rigidizer portion 70. When the first portion 26 of the substrate 22 is folded relative to the second portion 28 of the substrate 22, this will form a W-shape bend 72 as shown in FIGS. 4A and 4B.

Figure 5A:
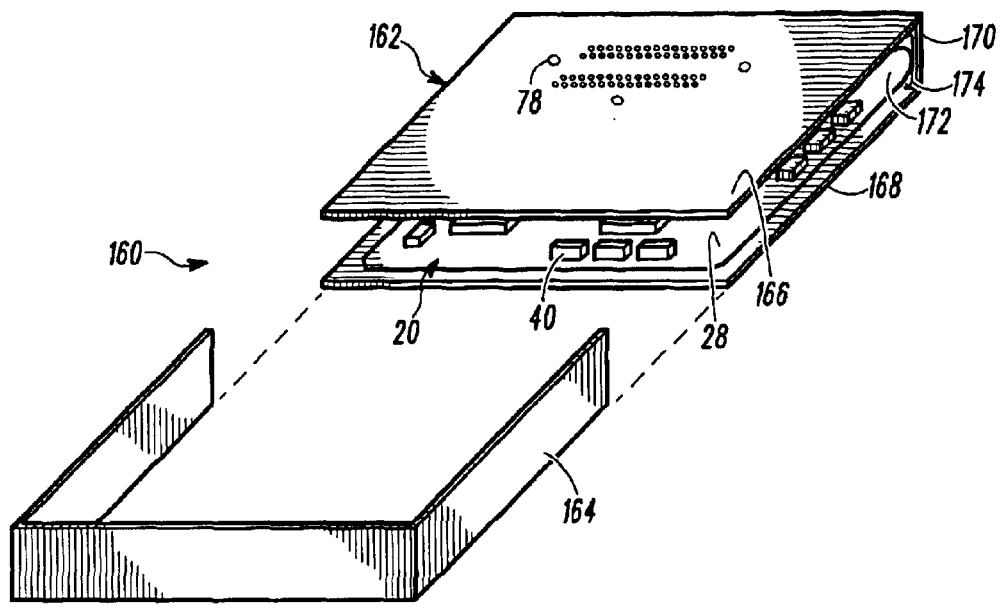
FIG. 5A is an exploded perspective view of an electronic control unit in accordance with another embodiment of the present invention.
Figure 5B:
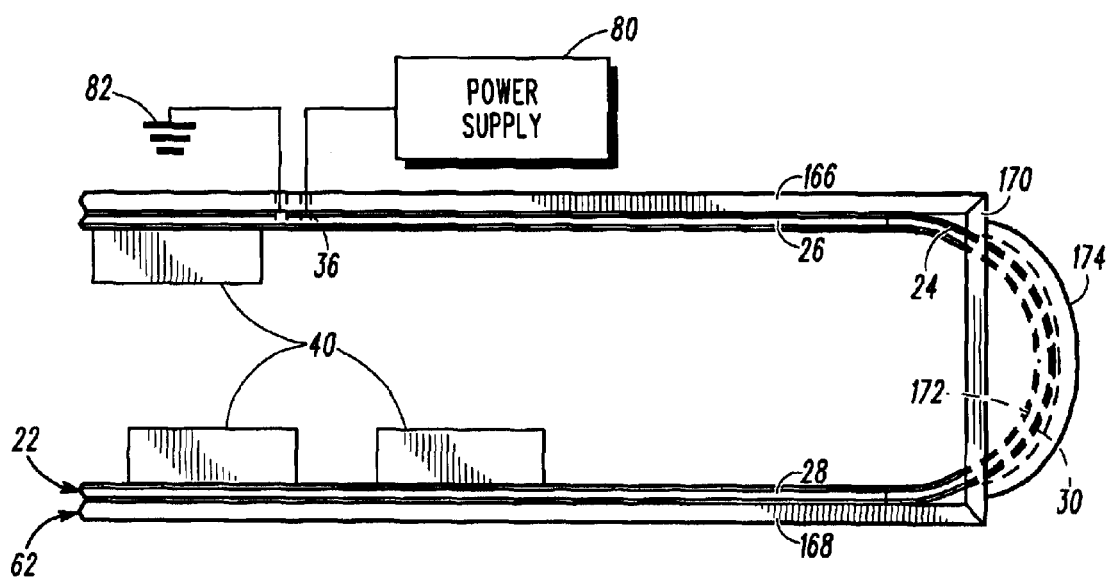
FIG. 5B is a side view of a portion of the electronic control unit in FIG. 5A.

Referring now to FIGS. 5A and 5B, another type of bend is shown in the bend region 30 of the substrate 22. FIG. 5A is an exploded perspective view of an electronic control unit 160 in accordance with another embodiment of the present invention. FIG. 5B is a side view of a portion of the electronic control unit 160. The electronic control unit 160 has a rigidizer 162 and the flexible circuit board 20. The rigidizer 162 has a first rigidizer portion 166 and a second rigidizer portion 168 interconnected by a connecting rigidizer portion 170. Here, however, the connecting rigidizer portion 170 has a depression 174. If the rigidizer is made of sheet aluminum, the depression 174 may be formed in the connecting rigidizer portion 170 by a stamping process.

The presence of the depression 174 in the connecting rigidizer portion 170 permits the bend 172 in the bend region 30 of the substrate 22 to be U-shaped. The depression 174 in the connecting rigidizer portion 170 is used for housing at least a portion of the bend 172 in the bend region 30 of the substrate 22. This U-shape also permits very compact folding that can be of particular importance for automotive and other industrial applications. The U-shape bend 172 may be formed after the first portion 26 of the substrate 22 is attached to the first rigidizer portion 166 and the second portion 28 of the substrate 22 is attached to the second rigidizer portion 168. The bend region 30 of the substrate 22 is not physically attached to the connecting rigidizer portion 170 or the depression 174. When the first portion 26 of the substrate 22 is folded relative to the second portion 28 of the substrate 22, this will form the U-shape bend 172 as shown in FIGS. 5A and 5B.

Figure 6:
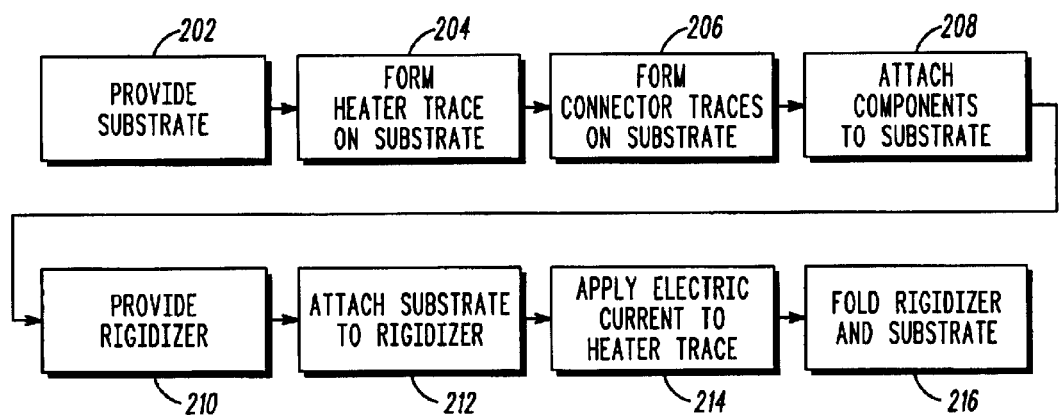
FIG. 6 is a flow diagram of one embodiment of a method for assembling an electronic control unit according to the present invention.

FIG. 6 is a flow diagram or method of assembling an electronic control unit that includes a rigidizer and a flexible circuit board in accordance with an embodiment of the present invention. As shown in block 202, the method includes the step of providing a substrate 22. The substrate 22 may be of a substantially rigid material such as FR4 or other organic based substrate material. In one embodiment, the provided substrate 22 has a first portion 26, a second portion 28 and a bend region 30. The bend region 30 interconnects the first portion 26 and the second portion 28.

The process proceeds in block 204 where the method further includes forming a heater trace 24 on the substrate 22. In particular, the heater trace 24 is formed on the bend region 30 of the substrate 22. In one embodiment, the heater trace 24 is formed in a serpentine shape that is uniform along the entire bend region 30. The heater trace 24 should be of sufficient width and length to provide heat to the bend region 30. In one embodiment, an adequate width of the heater trace 24 was found to be about 10 mils and the spacing between each serpentine trace was about 25 mils in pitch. The heater trace 24 may be deposited and etched to one side of the substrate 22. An insulation layer such as epoxy should cover the heater trace to provide insulation from other structures such as the rigidizer.

The process may proceed to block 206 where connector traces 38 are formed on the substrate 22. In one embodiment, the connector traces 38 are formed on a side opposite that of the side used when forming the heater trace 24 on the substrate 22. However, in more complex circuits, both sides of the substrate 22 may have connector traces 38 to interconnect components 40 on the substrate 22. The connector traces 38 may be formed on the substrate 22 by masking and etching techniques (chemical, mechanical or optical). Along with the connector traces 38, conductive pads may be located on the substrate 22 for attaching a plurality of electronic components 40.

As stated in block 208, the method may further include attaching a plurality of electronic components 40 to the substrate 22. In one embodiment, the components 40 are surface mountable components that may be auto-placed on the substrate 22 through a pick-and-place machine.

The process may then proceed to block 210 where a rigidizer 62 is provided. The rigidizer 62 is essentially the housing for the substrate 22 or flexible circuit board 20. In one embodiment, the rigidizer 62 has a first rigidizer portion 66, a second rigidizer portion 68, and a connecting rigidizer portion 70. The connecting rigidizer portion 70 interconnects the first rigidizer portion 66 and the second rigidizer portion 68. In one embodiment, the rigidizer 62 is made of a metallic material such as sheet aluminum. Additionally, in an alternative embodiment, the connecting rigidizer portion may be stamped with a depression 174.

At block 212, the method may further include attaching the substrate 22 to the rigidizer 62. Here, the first portion 26 of the substrate 22 may be attached to the first rigidizer portion 66 and the second portion 28 of the substrate 22 may be attached to the second rigidizer portion 68. In one embodiment, the attachment may be secured by an adhesive such as a pressure sensitive adhesive (PSA) tape or film. The attachment may also be by a liquid adhesive that is screen printed on the rigidizer and heat curable. Further, the attachment may also be by mechanical techniques or other adhesive laminates.

The process proceeds in block 214 where there is a step of applying an electrical current to the heater trace 24. The electrical current may be provided by an external power source 80. The current should be sufficient to generate heat in the heater trace 24 so that it heats the bend portion 30 of the substrate 22. When heated, the bend portion 30 of the substrate 22 becomes more soft and flexible. This allows the substrate 22 to be folded or otherwise bended into shape.

In block 216, the process further includes folding the first portion of the substrate relative to the second portion of the substrate to form at least one bend in the bend region of the substrate 22. As shown above, the bend may take a variety of shapes but in one embodiment the bend 72 is W-shaped and in another embodiment the bend 172 is U-shaped.

What has been described is a device and method for increasing the flexibility of a circuit board through localized heating. The device and method permits relatively small radii bends so that the circuit board may be more compactly folded than what could otherwise be accomplished using FR4 or similar relatively brittle materials. The alternative is to use single layer polyimide or similar flexible materials at a substantial cost penalty. The present invention also permits localized heating of only the area that requires the bend. This reduces the amount of energy needed for assembly costs that can be of particular interest in high volume production.

The above description of the present invention is intended to be exemplary only and is not intended to limit the scope of any patent issuing from this application. For example, the present discussion used an electronic control unit to illustrate the device and method of the present invention. The present invention is also applicable to other applications that use flexible circuits that need to be confined to a small area. The present invention is intended to be limited only by the scope and spirit of the following claims.

What is claimed is:

1. A flexible circuit board comprising:
   a substantially rigid substrate having a first portion and a second portion interconnected by a bend region, the substrate further having a connector hole; and
   an electrical resistance heater trace formed on the bend region of the substrate, the heater trace electrically connected to the connector hole;
   wherein the first portion of the substrate is capable of being folded relative to the second portion of the substrate to form at least one bend in the bend region when an electric current is applied to the heater trace.

2. The flexible circuit board of claim 1 wherein the substantially rigid substrate is made of at least one layer of glass weave impregnated with epoxy resin.

3. The flexible circuit board of claim 1 wherein the first portion and the second portion of the substrate are formed with conductive traces for interconnecting a plurality of electronic components, the bend region of the substrate formed with connecting traces for interconnecting the conductive traces formed an the first portion of the substrate with the conductive traces formed on the second portion of the substrate.

4. The flexible circuit board of claim 3 wherein the bend region of the substrate has a first side and a second side, the hearer trace formed on the first side of the bend region and the connecting traces formed on the second side of the bend region.

5. The flexible circuit board of claim 1 wherein the bend formed in the bend region is W-shaped.

6. The flexible circuit board of claim 1 wherein the heater trace is in a serpentine shape that extends uniformly across the bend region.

7. An electronic control unit comprising;
a rigidizer having a first rigidizer portion and a second rigidizer portion interconnected by a connecting rigidizer portion having a depression;
a substantially rigid substrate having a first portion and a second portion interconnected by a bend region, the first portion of the substrate attached to the first rigidizer portion, the second portion of the substrate attached to the second rigidizer portion, at least a portion of the bend in the bend region of the substrate being housed in the depression of the rigidizer; and
an electrical resistance heater trace formed on the bend region of the substrate;
wherein the first portion of the substrate is capable of being folded relative to the second portion of the substrate to form at least one bend in the bend region when an electric current is applied to the heater trace.

8. The electronic control unit of claim 7 wherein the substantially rigid substrate is made of at least one layer of glass weave impregnated with epoxy resin.

9. The electronic control unit of claim 7 wherein the first portion and the second portion of the substrate are formed with conductive traces for interconnecting a plurality of electronic components, the bend region of the substrate formed with connecting traces for interconnecting the conductive traces formed on the first partion of the substrate with the conductive traces formed on the second portion of the substrate.

10. The electronic control unit of claim 9 wherein the bend region of the substrate has a first side and a second side, the heater trace formed on the first side of the bend region and the connecting traces formed on the second side of the bend region.

11. The electronic control unit of claim 7 wherein the substrate further has a connector hole, the heater trace electrically connected to the connector hole.

12. The electronic control unit of claim 7 wherein the bend formed in the bend region is W-shaped.

13. The electronic control unit of claim 7 wherein the heater trace is in a serpentine shape that extends uniformly across the bend region.

14. A method for assembling an electronic control unit comprising the steps of:
providing a substantially rigid substrate having a first portion and a second portion interconnected by a bend region;
forming an electrical resistance heater trace on the bend region of the substrate;
providing a rigidizer having a first rigidizer portion and a second rigidizer portion interconnected by a connecting rigidizer portion having a depression;
attaching the first portion of the substrate to the first rigidizer portion;
attaching the second portion of the substrate to the second rigidizer portion;
applying an electrical current to the electrical resistance heater trace;
folding the first portion of the substrate relative to the second portion of the substrate to form at least one bend in the bend region such that at least a portion of the bend in the bend region is housed in the depression.

15. The method of claim 14 wherein the substantially rigid substrate is made of at learn one layer of glass weave impregnated with epoxy resin.

16. The method of claim 14 including the additional steps of:
forming conductive traces on the first portion and the second portion of the substrate for interconnecting a plurality of electronic components; and
forming connecting traces on the bend region of the substrate for interconnecting the conductive traces formed on the first portion of the substrate with the conductive traces formed an the second portion of the substrate.

17. The method of claim 14 wherein the step of attaching the first portion of the substrate to the first rigidizer portion and the step of attaching the second portion of the substrate to the second rigidizer portion includes the use of a pressure sensitive adhesive.

* * * * *